United States Patent
Huang

(10) Patent No.: US 8,145,971 B2
(45) Date of Patent: Mar. 27, 2012

(54) DATA PROCESSING SYSTEMS AND METHODS FOR PROCESSING DIGITAL DATA WITH LOW DENSITY PARITY CHECK MATRIX

(75) Inventor: Wei-Hung Huang, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 1065 days.

(21) Appl. No.: 11/944,636

(22) Filed: Nov. 26, 2007

(65) Prior Publication Data

US 2008/0126917 A1    May 29, 2008

Related U.S. Application Data

(60) Provisional application No. 60/867,589, filed on Nov. 29, 2006.

(51) Int. Cl.
*H03M 13/00*    (2006.01)
(52) U.S. Cl. ............... 714/752; 714/786; 714/801
(58) Field of Classification Search ........... 714/752, 714/801
See application file for complete search history.

(56) References Cited

U.S. PATENT DOCUMENTS

| | | | |
|---|---|---|---|
| 6,961,888 B2 | 11/2005 | Jin et al. | |
| 7,120,856 B2 * | 10/2006 | Zhang et al. | 714/801 |
| 7,493,548 B2 * | 2/2009 | Nimbalker et al. | 714/758 |
| 7,793,146 B1 * | 9/2010 | Gibson et al. | 714/6.13 |
| 7,934,146 B2 * | 4/2011 | Stolpman | 714/800 |
| 2004/0148560 A1 | 7/2004 | Hocevar | |
| 2005/0223305 A1 | 10/2005 | Kons | |
| 2005/0264998 A1 | 12/2005 | McCutcheon | |

OTHER PUBLICATIONS

Seho Myung, Kyeongcheol Yang, and Jaeyoel Kim, Quasi-Cyclic LDPC Codes for Fast Encoding, IEEE Transactions on Information Theory, vol. 51, No. 8, Aug. 2005, pp. 2894-2901.
"Sparse Storage Technique for Sparse Matrix" by Zhang Yongjie, Sun Qin, School of Aeronautics, Northwestern Polytechnical University, 710072,Changchun Univ Technical Journal, Sep. 2006.

* cited by examiner

*Primary Examiner* — Esaw Abraham
(74) *Attorney, Agent, or Firm* — Winston Hsu; Scott Margo

(57) ABSTRACT

A data processing system for processing digital data with a low density parity check (LDPC) matrix includes: a storage device for storing a plurality of indices representing a plurality of shifting numbers, where the LDPC matrix comprises an array of elements, and at least one element of the LDPC matrix represents a cyclic permutation matrix that is produced by cyclically shifting columns of an identity matrix to the right according to one of the shifting numbers; and a processing circuit, coupled to the storage device, for retrieving at least one index to recover at least one element of the LDPC matrix according to the index and performing data processing according to the LDPC matrix.

20 Claims, 10 Drawing Sheets

$$H = \begin{bmatrix} Pa_{1,1} & Pa_{1,2} & \cdots & Pa_{1,(c-1)} & Pa_{1,c} \\ Pa_{2,1} & Pa_{2,2} & \cdots & Pa_{2,(c-1)} & Pa_{2,c} \\ \cdots & \cdots & \cdots & \cdots & \cdots \\ Pa_{m,1} & Pa_{m,2} & \cdots & Pa_{m,(c-1)} & Pa_{m,c} \end{bmatrix}$$

FIG. 1 RELATED ART $$P_0 = \begin{bmatrix} 0 & 0 & 0 & 0 & 0 & 0 & 0 & 1 \\ 0 & 0 & 0 & 0 & 0 & 0 & 1 & 0 \\ 0 & 0 & 0 & 0 & 0 & 1 & 0 & 0 \\ 0 & 0 & 0 & 0 & 1 & 0 & 0 & 0 \\ 0 & 0 & 0 & 1 & 0 & 0 & 0 & 0 \\ 0 & 0 & 1 & 0 & 0 & 0 & 0 & 0 \\ 0 & 1 & 0 & 0 & 0 & 0 & 0 & 0 \\ 1 & 0 & 0 & 0 & 0 & 0 & 0 & 0 \end{bmatrix}$$

FIG. 2 RELATED ART $$P_1 = \begin{bmatrix} 0 & 0 & 0 & 0 & 0 & 0 & 1 & 0 \\ 0 & 0 & 0 & 0 & 0 & 1 & 0 & 0 \\ 0 & 0 & 0 & 0 & 1 & 0 & 0 & 0 \\ 0 & 0 & 0 & 1 & 0 & 0 & 0 & 0 \\ 0 & 0 & 1 & 0 & 0 & 0 & 0 & 0 \\ 0 & 1 & 0 & 0 & 0 & 0 & 0 & 0 \\ 1 & 0 & 0 & 0 & 0 & 0 & 0 & 0 \\ 0 & 0 & 0 & 0 & 0 & 0 & 0 & 1 \end{bmatrix}$$

FIG. 3 RELATED ART $$P_5 = \begin{bmatrix} 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 1 & 0 & 0 & 0 & 0 & 0 & 0 & 1 \\ 0 & 1 & 0 & 0 & 0 & 0 & 0 & 0 \\ 0 & 0 & 1 & 0 & 0 & 0 & 0 & 0 \end{bmatrix}$$

FIG. 4 RELATED ART

FIG. 8

DATA PROCESSING SYSTEMS AND METHODS FOR PROCESSING DIGITAL DATA WITH LOW DENSITY PARITY CHECK MATRIX

CROSS REFERENCE TO RELATED APPLICATIONS

This application claims the benefit of U.S. provisional application No. 60/867,589, which was filed on Nov. 29, 2006 and is entitled "LDPC PARITY CHECK MATRIX STORING".

BACKGROUND

The present invention relates to low density parity check (LDPC) codes, and more particularly, to methods and system designs for efficiently storing LDPC matrices typically used in WiMAX, 802.11n, and other communication systems.

LDPC codes have become one of the hottest topics in current coding theory. First appearing around the middle of the twentieth century, LDPC codes have experienced an amazing comeback in the last few years since they are already equipped with very fast (probabilistic) encoding and decoding algorithms. Recovering the original codeword in the face of large amounts of noise was previously the most important issue, however, new analytic and combinatorial tools make it possible to solve related design problems. As a result, LDPC codes are not only attractive from a theoretical point of view, but also suitable for practical applications.

Regarding implementation of encoding (or decoding) LDPC codes using a generator matrix, storing a very large matrix is required according to the related art, where LDPC codes typically require large blocks of a matrix to be effective and ready for use, so as to achieve better performance. Consequently, even though parity check matrices of LDPC codes may be sparse in some occasions, how to store these matrices in a cost-effective manner without hindering the performance is still a thorny problem for developers and researchers.

Please refer to FIG. 1. FIG. 1 illustrates a parity check matrix H of LDPC codes according to the related art, where a subscript $a_{j,k}$ of an element of the parity check matrix H may represent a shifting number i (which is typically a non-negative integer as known by those skilled in the related art), so this element can be referred to as $P_i$. Typically, each of a plurality of elements of the parity check matrix H is defined as a cyclic permutation matrix of a size L by L, with L representing a sub-block size, which is a sub-matrix size for the parity check matrix H. As shown in FIG. 2, FIG. 3, and FIG. 4, some examples of cyclic permutation matrices $P_i$ with L=8 according to the related art are illustrated for better comprehension. Generally speaking, the cyclic permutation matrix $P_i$ is produced by cyclically shifting columns of an identity matrix to the right by i number of places, where the cyclic permutation matrix $P_i$ is substantially the identity matrix if the shifting number i is zero.

Regarding a larger number of the sub-matrix size L, for example, L=81, if the height and the width of the parity check matrix H are respectively 12 and 24 (i.e. m=12 and c=24), the corresponding codeword block length n may reach 1944 bits (i.e. 243 bytes) and the total storage volume required for the parity check matrix H may reach 2916 bytes. It is noted that storing different parity check matrices corresponding to various conditions (e.g. various code rates or various transmission parameters) is typically required according to the related art. Therefore, storage requirements for these parity check matrices have become an important issue.

SUMMARY

It is an objective of the claimed invention to provide data processing systems and methods for processing digital data with a low density parity check (LDPC) matrix.

It is another objective of the claimed invention to provide data processing systems and methods for processing digital data with an LDPC matrix, in order to minimize storage requirements without introducing greater complexity and without hindering LDPC encoding/decoding performance.

An exemplary embodiment of a data processing system for processing digital data with an LDPC matrix comprises: a storage device for storing a plurality of indices representing a plurality of shifting numbers, wherein the LDPC matrix comprises an array of elements, and at least one element of the LDPC matrix represents a cyclic permutation matrix that is produced by cyclically shifting columns of an identity matrix to the right according to one of the shifting numbers; and a processing circuit, coupled to the storage device, for retrieving at least one index to recover at least one element of the LDPC matrix according to the index and performing data processing according to the LDPC matrix.

An exemplary embodiment of a data processing method for processing digital data with an LDPC matrix comprises: storing a plurality of indices representing a plurality of shifting numbers, wherein the LDPC matrix comprises an array of elements, and at least one element of the LDPC matrix represents a cyclic permutation matrix that is produced by cyclically shifting columns of an identity matrix to the right according to one of the shifting numbers; and retrieving at least one index to recover at least one element of the LDPC matrix according to the index and performing data processing according to the LDPC matrix.

An exemplary embodiment of a data processing system for processing digital data with a partially regular LDPC matrix comprises: a storage device, wherein the partially regular LDPC matrix comprises an array of elements, at least one element of the partially regular LDPC matrix represents a cyclic permutation matrix that is produced by cyclically shifting columns of an identity matrix to the right according to a shifting number, the partially regular LDPC comprises at least one regular portion and at least one non-regular portion, and the storage device stores a plurality of indices corresponding to the non-regular portion; and a processing circuit, coupled to the storage device, for retrieving at least one index to recover at least one element of the partially regular LDPC matrix according to the index and performing data processing according to the partially regular LDPC matrix.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 illustrates a parity check matrix of low density parity check (LDPC) codes according to the related art.

FIG. 2, FIG. 3, and FIG. 4 illustrate examples of cyclic-permutation matrices of a certain sub-block size according to the related art.

FIG. 8 illustrates an example of a subscript matrix corresponding to a quasi-cyclic LDPC (QC-LDPC) matrix utilized in the embodiment shown in FIG. 5.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 5:
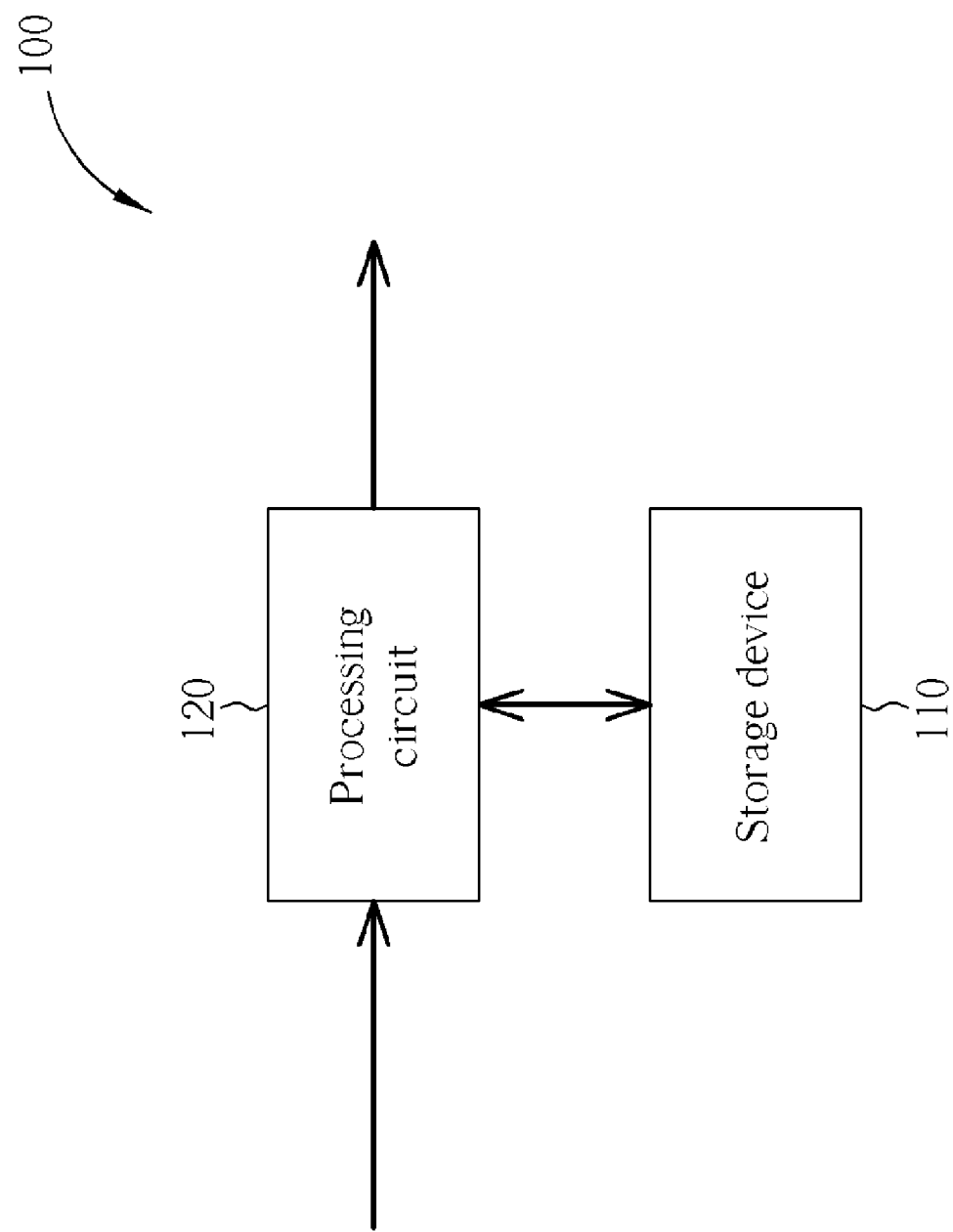
FIG. 5 is a diagram of a data processing system for processing digital data with an LDPC matrix according to one embodiment of the present invention.

Some notations such as H, $P_i$, $a_{j,k}$, m, c, and L mentioned above are utilized herein for better comprehension and for simplicity. Please refer to FIG. 5. FIG. 5 is a diagram of a data processing system 100 for processing digital data with a low density parity check (LDPC) matrix, such as the parity check matrix H mentioned above, according to a first embodiment of the present invention, where the data processing system 100 comprises a storage device 110 and a processing circuit 120. The storage device 110 of this embodiment is a memory, and is capable of storing a plurality of indices representing a plurality of shifting numbers such as the shifting number i mentioned above. More particularly in this embodiment, the plurality of indices substantially corresponds to the plurality of shifting numbers.

According to the first embodiment, the LDPC matrix such as the parity check matrix H shown in FIG. 1 comprises an array of elements, where at least one element of the LDPC matrix represents a cyclic permutation matrix produced by cyclically shifting columns of an identity matrix to the right according to one of the shifting numbers. More particularly in this embodiment, the cyclic permutation matrix (e.g. one of those shown in FIG. 2, FIG. 3, and FIG. 4 if L=8) is produced by cyclically shifting the columns of the identity matrix to the right by a number of places, where the number is one of the shifting numbers mentioned above. Please note that, according to the mathematical definition in this embodiment, if a shifting number is zero so a corresponding cyclic permutation matrix is produced by cyclically shifting the columns of the identity matrix to the right by "zero" places, the corresponding cyclic permutation matrix is substantially the identity matrix.

Figure 6:
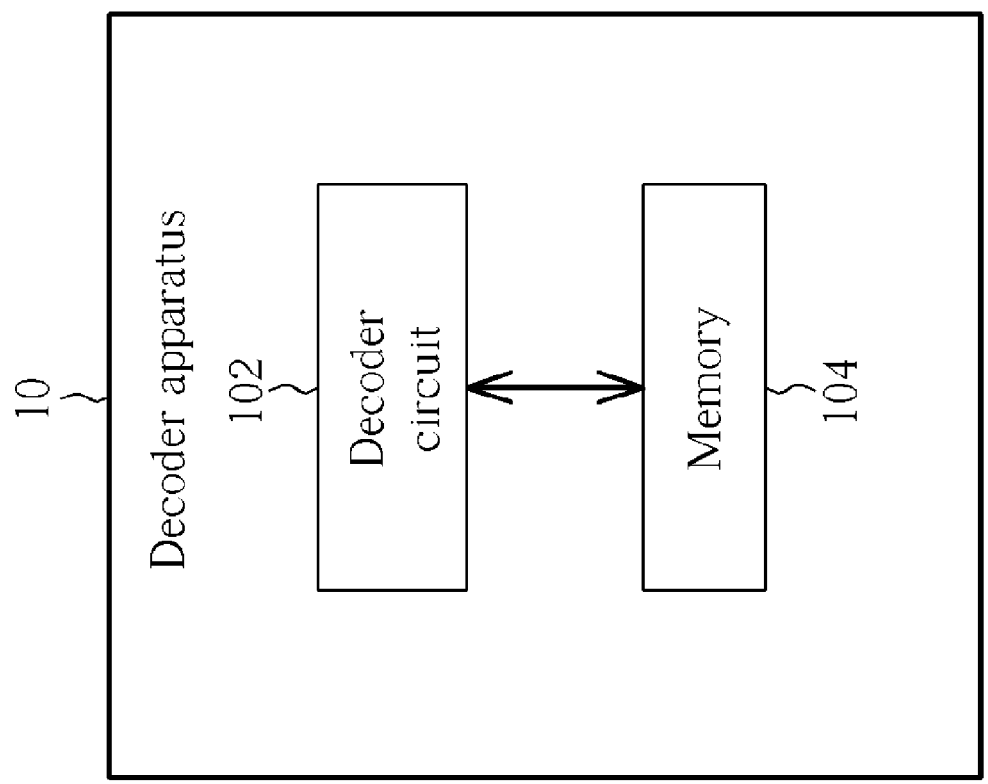
FIG. 6 is a diagram of a decoder apparatus according to another embodiment of the present invention, where the embodiment shown in FIG. 6 illustrates a special case of the embodiment shown in FIG. 5.

The processing circuit 120 of this embodiment is capable of retrieving at least one index to recover at least one element of the LDPC matrix according to the index, and is capable of performing data processing according to the LDPC matrix. Referring to FIG. 6 illustrating a special case of the embodiment shown in FIG. 5, the data processing system 100 shown in FIG. 5 can be a decoding system such as the decoder apparatus 10 shown in FIG. 6, where the processing circuit 120 shown in FIG. 5 can be the decoder circuit 102 shown in FIG. 6 with the memory 104 shown in FIG. 6 corresponding to the storage device 110 shown in FIG. 5. The decoder circuit 102 is capable of accessing the memory 104 and decoding LDPC-encoded data according to at least the element of the LDPC matrix, in order to perform decoding by applying at least the LDPC matrix. Conversely, referring to FIG. 7, which illustrates another special case of the embodiment shown in FIG. 5, the data processing system 100 shown in FIG. 5 can be an encoding system such as the encoder apparatus 20 shown in FIG. 7, where the processing circuit 120 shown in FIG. 5 can be the encoder circuit 202 shown in FIG. 7 with the memory 204 shown in FIG. 7 corresponding to the storage device 110 shown in FIG. 5, and the encoder circuit 202 is capable of accessing the memory 204 and encoding data according to at least the element of the LDPC matrix, in order to perform encoding by using at least the LDPC matrix.

Figure 7:
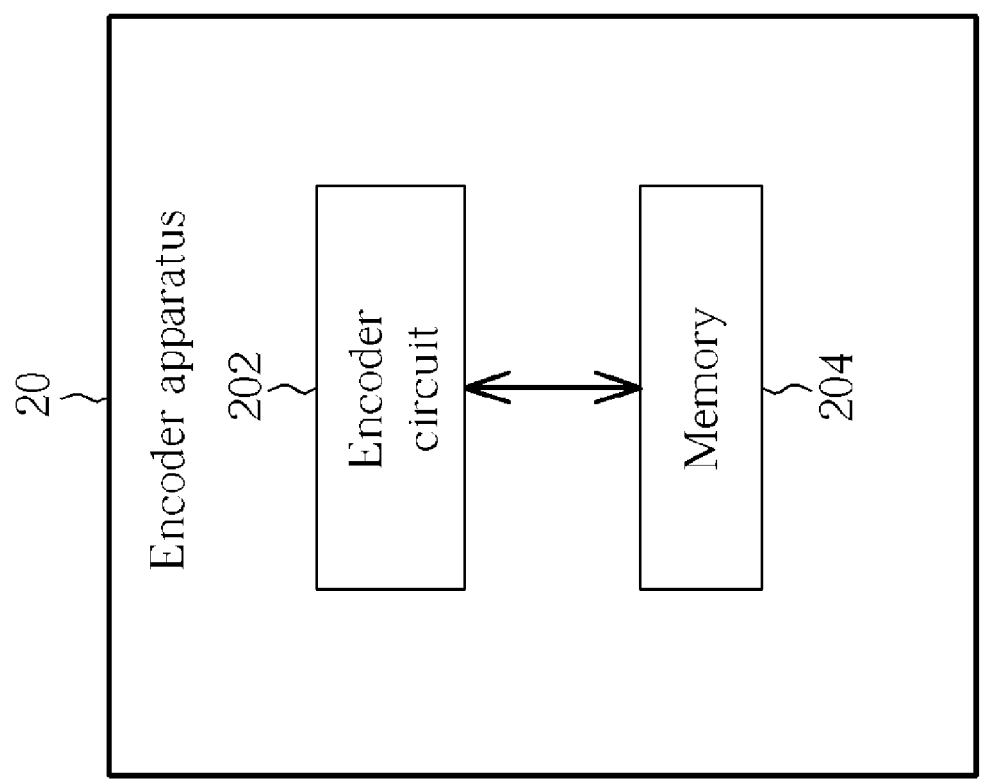
FIG. 7 is a diagram of an encoder apparatus according to another embodiment of the present invention, where the embodiment shown in FIG. 7 illustrates another special case of the embodiment shown in FIG. 5.
Figure 8:
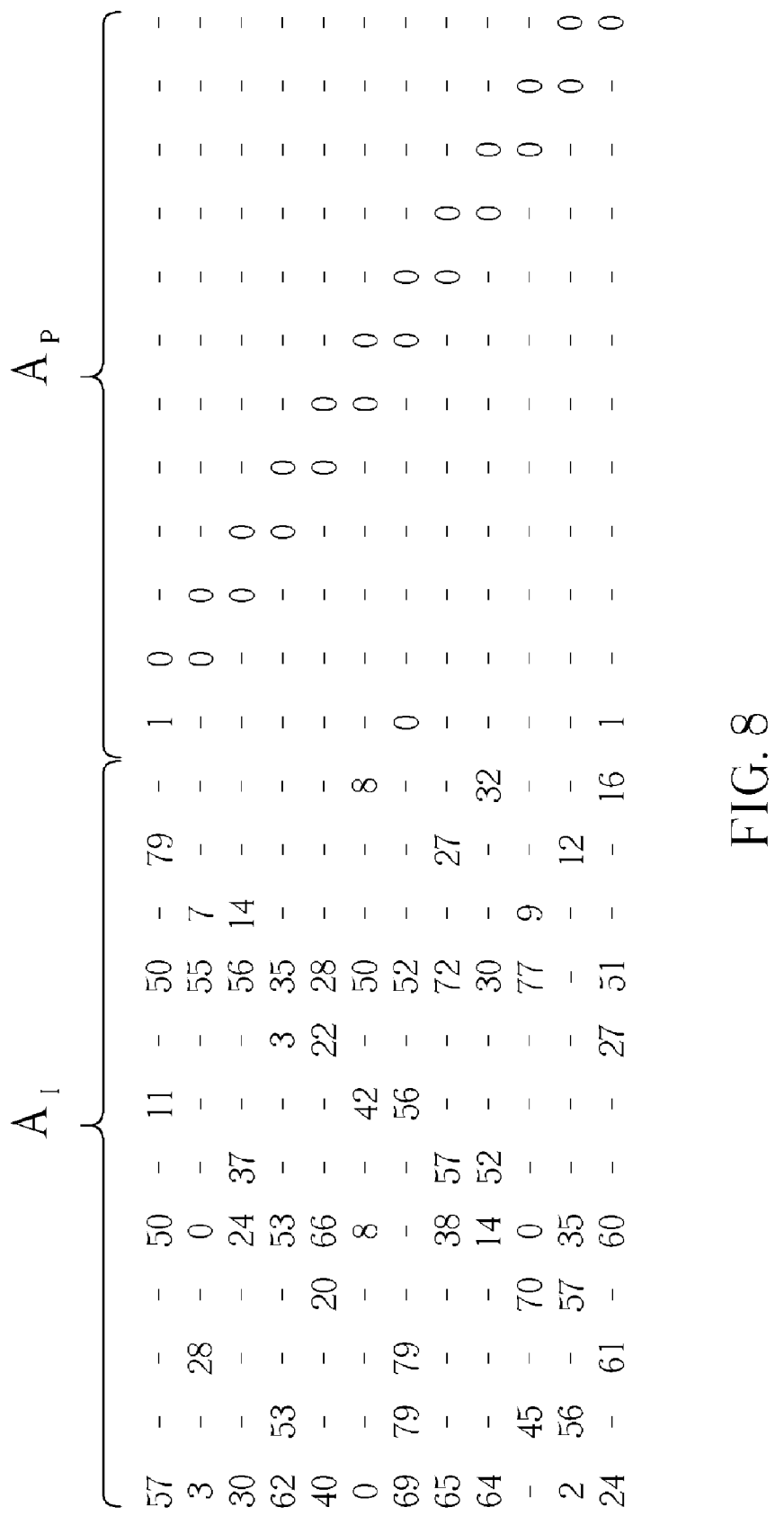

In the following, an encoding scheme such as that provided in the embodiment shown in FIG. 7 is first taken as an example for explaining the operations of the data processing system 100 and the method thereof in detail. According to the first embodiment, the parity check matrix H is a quasi-cyclic LDPC (QC-LDPC) matrix such as that corresponding to a subscript matrix $A=[a_{j,k}]$ (j=1, 2, ..., m; k=1, 2, ..., c) shown in FIG. 8 with m=12 and c=24, where some elements of the subscript matrix A with the label "-" as shown in FIG. 8 represent zero sub-matrices. Here, the parity check matrix H can be divided into two portions, i.e. $[H_I|H_p]$, with $H_p$ complying with some rules, where the portion $H_p$ can be considered as a regular portion, and the portion $H_I$ can be considered as a non-regular portion. As the rules mentioned above or corresponding parameters related to the rules can be stored in the storage device 110, the data processing system 100 may utilize the rules or the corresponding parameters thereof to recover the portion $H_p$. Therefore, the storage requirement corresponding to the portion $H_p$ can be minimized.

In addition, the subscript matrix A can be divided into two portions correspondingly, i.e. $[A_I|A_p]$ such as those shown in FIG. 8. Rather than storing any sub-matrix $P_i$ of the parity check matrix H (e.g. storing sub-matrices $P_{57}$, $P_{50}$, $P_{11}$, ..., etc. as typically suggested according to the related art), the storage device 110 stores a plurality of elements $a_{j,k}$ of the subscript matrix A (e.g. the values 57, 50, 11, ..., etc.) as the plurality of indices, which means the storage device 110 of this embodiment stores the shifting numbers mentioned above (e.g. the shifting number i) as the indices. As a result, the goal of minimizing storage requirements without introducing greater complexity and without hindering LDPC encoding performance can be achieved since the processing circuit 120 is capable of retrieving at least one index to recover at least one element of the LDPC matrix (e.g. the sub-matrices $P_{57}$, $P_{50}$, $P_{11}$, ..., etc. of the QC-LDPC matrix) according to the index. Regarding a large number of the sub-matrix size L, for example, L=81, the storage requirements are therefore greatly minimized.

According to this embodiment, the plurality of indices respectively corresponds to a plurality of non-zero sub-matrices of $H_I$, and the storage device 110 further stores a plurality of distance parameters respectively corresponding to distances between adjacent non-zero sub-matrices of $H_l$. If the distance parameters correspond to row directions, which means the distances or distance parameters are measured along the row directions, the storage device 110 may store distance parameters (e.g. 4, 2, 2, ..., etc.) respectively corresponding to distances in a value-run form such as (57, 4), (50, 2), (11, 2), ..., etc., where "4" in (57, 4) represents that the distance between the corresponding sub-matrices $P_{57}$ and $P_{50}$ in the first row of the QC-LDPC matrix (i.e. the distance between the values 57 and 50 in the first row of the subscript matrix A) is equal to 4, and "2" in (50, 2) represents that the distance between the corresponding sub-matrices $P_{50}$ and $P_{11}$ in the first row of the QC-LDPC matrix (i.e. the distance between the values 50 and 11 in the first row of the subscript matrix A) is equal to 2, and so on.

According to a variation of this embodiment, the distance parameters may correspond to column directions, which means the distances or distance parameters are measured along the column directions.

According to another variation of this embodiment, the storage device 110 may store distance parameters (e.g. 0, 4, 2, ..., etc.) respectively corresponding to distances in a run-value form such as (0, 57), (4, 50), (2, 11), ..., etc., where "0" in (0, 57) represents that the first sub-matrix $P_{57}$ in the first row of the QC-LDPC matrix (or the first value 57 in the first row of the subscript matrix A) is at the initial location (i.e. the upper-left corner in this embodiment), "4" in (4, 50) represents that the distance between the corresponding sub-matrices $P_{57}$ and $P_{50}$ in the first row of the QC-LDPC matrix (i.e. the distance between the values 57 and 50 in the first row of the subscript matrix A) is equal to 4, and "2" in (2, 11) represents that the distance between the corresponding sub-matrices $P_{50}$ and $P_{11}$ in the first row of the QC-LDPC matrix (i.e. the distance between the values 50 and 11 in the first row of the subscript matrix A) is equal to 2, and so on.

According to another variation of this embodiment, the storage device 110 may store a plurality of distance parameters respectively corresponding to numbers of zero sub-matrices between adjacent non-zero sub-matrices of $H_l$. If the distance parameters correspond to row directions, the storage device 110 may store distance parameters (e.g. 3, 1, 1, ..., etc.) respectively corresponding to distances in a value-run form such as (57, 3), (50, 1), (11, 1), ..., etc., where "3" in (57, 3) represents that the number of zero sub-matrices between the adjacent non-zero sub-matrices $P_{57}$ and $P_{50}$ is equal to 3, and "1" in (50, 1) represents that the number of zero sub-matrices between the adjacent non-zero sub-matrices $P_{50}$ and $P_{11}$ is equal to 1, and so on.

According to a second embodiment, which is a variation of the first embodiment, the plurality of indices respectively corresponds to a plurality of non-zero sub-matrices of $H_l$ as mentioned above, however, the storage device 110 further stores a plurality of location parameters respectively corresponding to locations of the non-zero sub-matrices of $H_l$. If the location parameters correspond to both row locations and column locations of the non-zero sub-matrices of $H_l$, the storage device 110 may store location parameters (e.g. (1, 1), (1, 5), (1, 7), ..., etc.) respectively corresponding to the locations of the non-zero sub-matrices $P_{57}$, $P_{50}$, $P_{11}$, ..., etc. of $H_l$ in a value-locate form such as (57, 1, 1), (50, 1, 5), (11, 1, 7), ..., etc., where (1, 1) carried in (57, 1, 1) represents that the location of the first sub-matrix $P_{57}$ in the first row of the QC-LDPC matrix (or the first value 57 in the first row of the subscript matrix A) is at (1, 1) (i.e. the upper-left corner in this embodiment), (1, 5) carried in (50, 1, 5) represents that the location of the sub-matrix $P_{50}$ in the first row of the QC-LDPC matrix (or the value 50 in the first row of the subscript matrix A) is at (1, 5), and so on.

According to a variation of this embodiment, the storage device 110 may store location parameters (e.g. (1, 1), (1, 5), (1, 7), ..., etc.) respectively corresponding to the locations of the non-zero sub-matrices $P_{57}$, $P_{50}$, $P_{11}$, ..., etc. of $H_l$ in a locate-value form such as (1, 1, 57), (1, 5, 50), (1, 7, 11), ..., etc., where the meanings thereof can be derived according to the descriptions disclosed above, and are therefore not explained in detail here.

According to another variation of this embodiment, the location parameters may correspond to only the row locations of the non-zero sub-matrices of $H_l$. For example, the storage device 110 may store location parameters (e.g. 1, 13, 25, ..., etc.) respectively corresponding to the row locations of the non-zero sub-matrices $P_{57}$, $P_3$, $P_{30}$, ..., etc. (which are in the beginning of the first row, the second row, the third row, ..., etc. of $H_l$, respectively) in a value-locate form such as (57, 1), (3, 13), (30, 25), ..., etc., where 1 represents the first column location in the first row, 13 represents the first column location in the second row (since 13 mod 12 equals to 1), 25 represents the first column location in the third row (since 25 mod 12 equals to 1), and so on.

According to another variation of this embodiment, the location parameters correspond to only the column locations of the non-zero sub-matrices of $H_l$. Similar descriptions are not repeated here for this variation.

Figure 9:
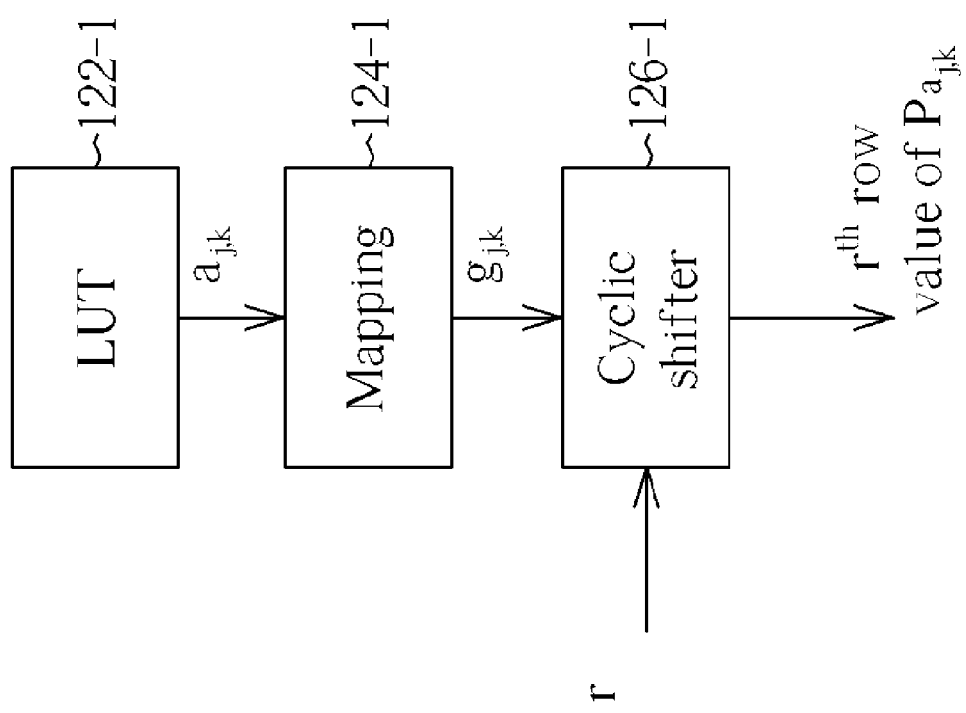
FIG. 9 is a diagram of an exemplary LDPC matrix element generator for the data processing system shown in FIG. 5 according to one embodiment of the present invention.

FIG. 9 is a diagram illustrating an example of an LDPC matrix element generator for the data processing system 100 shown in FIG. 5 according to one embodiment of the present invention, where the LDPC matrix element generator shown in FIG. 9 comprises a look up table (LUT) 122-1, a mapping unit 124-1, and a cyclic shifter 126-1. As shown in FIG. 9, the LUT 122-1 of this embodiment outputs $a_{j,k}$ to the mapping unit 124-1 according to an index stored in the storage device 110, and then the mapping unit 124-1 maps $a_{j,k}$ into an intermediate matrix element $g_{j,k}$, which indicates first row of $P_{a_{j,k}}$ as explained above. In addition, the cyclic shifter 126-1 of this embodiment receives a row index r generated within the processing circuit 120, and further performs a cyclic shifting operation on the intermediate matrix element $g_{j,k}$ to generate the $r^{th}$ row value of the element under processing within the LDPC matrix, as shown in FIG. 9.

Figure 10:
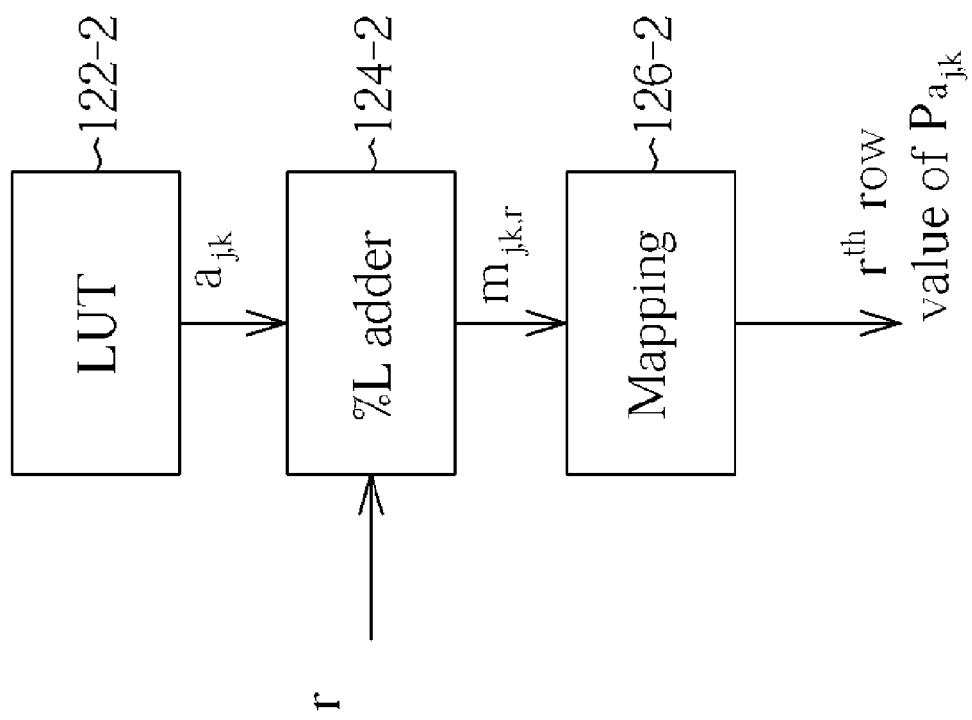
FIG. 10 is a diagram of another exemplary LDPC matrix element generator for the data processing system shown in FIG. 5 according to another embodiment of the present invention.

FIG. 10 is a diagram illustrating another example of an LDPC matrix element generator for the data processing system 100 shown in FIG. 5 according to another embodiment of the present invention, where the LDPC matrix element generator shown in FIG. 10 comprises a LUT 122-2, a % L (modulo L) adder 124-2, and a mapping unit 126-2. As shown in FIG. 10, the LUT 122-2 of this embodiment outputs $a_{j,k}$ to the % L adder 124-2 according to an index stored in the storage device 110, and then the % L adder 124-2 performs a mod operation on the row index r (i.e. r modulo L) and derives the intermediate matrix element $m_{j,k,r}$ accordingly. In addition, the mapping unit 126-2 maps the intermediate matrix element $m_{j,k,r}$ into the $r^{th}$ row value of the element under processing within the LDPC matrix, as shown in FIG. 10.

In contrast to the related art, the present invention's data processing systems and methods are capable of minimizing storage requirements without introducing greater complexity and without hindering LDPC encoding/decoding performance.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A data processing system for processing digital data with a low density parity check (LDPC) matrix, the data processing system comprising:
   a storage device for storing a plurality of indices representing a plurality of shifting numbers, wherein the LDPC matrix comprises an array of elements, and at least one element of the LDPC matrix represents a cyclic permutation matrix that is produced by cyclically shifting columns of an identity matrix to the right according to one of the shifting numbers; and
   a processing circuit, coupled to the storage device, for retrieving at least one index to recover at least one element of the LDPC matrix according to the index and performing data processing according to the LDPC matrix;
   wherein the LDPC matrix is for being divided into a regular portion and a non-regular portion, and the plurality of indices respectively corresponds to a plurality of non-zero sub-matrices of the non-regular portion; and
   the storage device further stores a plurality of distance parameters respectively corresponding to distances between adjacent non-zero sub-matrices of the non-regular portion, or the storage device further stores a plurality of distance parameters respectively corresponding to numbers of zero sub-matrices between adjacent non-zero sub-matrices of the non-regular portion.

2. The data processing system of claim 1, wherein the data processing system is an encoding system, and the processing circuit is an encoder circuit for encoding data according to the LDPC matrix.

3. The data processing system of claim 1, wherein the data processing system is a decoding system, and the processing circuit is a decoder circuit for decoding data according to the LDPC matrix.

4. The data processing system of claim 1, wherein the LDPC matrix is a quasi-cyclic LDPC (QC-LDPC) matrix.

5. The data processing system of claim 1, wherein the plurality of indices is the plurality of shifting numbers respectively.

6. The data processing system of claim 1, wherein the distance parameters correspond to row or column directions.

7. The data processing system of claim 1, wherein the LDPC matrix is for being divided into a regular portion and a non-regular portion, the plurality of indices respectively corresponds to a plurality of non-zero sub-matrices of the non-regular portion, and the storage device further stores a plurality of location parameters respectively corresponding to locations of the non-zero sub-matrices of the non-regular portion.

8. The data processing system of claim 7, wherein the location parameters correspond to both row locations and column locations of the non-zero sub-matrices of the non-regular portion.

9. The data processing system of claim 7, wherein the location parameters correspond to only row locations or only column locations of the non-zero sub-matrices of the non-regular portion.

10. The data processing system of claim 1, wherein the data processing system complies with WiFi or WiMAX specifications.

11. A data processing method for processing digital data with a low density parity check (LDPC) matrix, the data processing method comprising:
   storing a plurality of indices representing a plurality of shifting numbers, wherein the LDPC matrix comprises an array of elements, and at least one element of the LDPC matrix represents a cyclic permutation matrix that is produced by cyclically shifting columns of an identity matrix to the right according to one of the shifting numbers; and
   retrieving at least one index to recover at least one element of the LDPC matrix according to the index and performing data processing according to the LDPC matrix;
   wherein the LDPC matrix is for being divided into a regular portion and a non-regular portion, the plurality of indices respectively corresponds to a plurality of non-zero sub-matrices of the non-regular portion, and the method further comprises:
   storing a plurality of distance parameters respectively corresponding to distances between adjacent non-zero sub-matrices of the non-regular portion; or
   storing a plurality of distance parameters respectively corresponding to numbers of zero sub-matrices between adjacent non-zero sub-matrices of the non-regular portion.

12. The data processing method of claim 11, wherein the step of performing data processing according to the LDPC matrix further comprises: encoding data according to the LDPC matrix.

13. The data processing method of claim 11, wherein the step of performing data processing according to the LDPC matrix further comprises: decoding data according to the LDPC matrix.

14. The data processing method of claim 11, wherein the LDPC matrix is a quasi-cyclic LDPC (QC-LDPC) matrix.

15. The data processing method of claim 11, wherein the plurality of indices is the plurality of shifting numbers respectively.

16. The data processing method of claim 11, wherein the distance parameters correspond to row or column directions.

17. The data processing method of claim 11, wherein the LDPC matrix is for being divided into a regular portion and a non-regular portion, the plurality of indices respectively corresponds to a plurality of non-zero sub-matrices of the non-regular portion, and the method further comprises: storing a plurality of location parameters respectively corresponding to locations of the non-zero sub-matrices of the non-regular portion.

18. The data processing method of claim 17, wherein the location parameters correspond to both row locations and column locations of the non-zero sub-matrices of the non-regular portion.

19. The data processing method of claim 17, wherein the location parameters correspond to only row locations or only column locations of the non-zero sub-matrices of the non-regular portion.

20. The data processing method of claim 11, wherein the data processing complies with WiFi or WiMAX specifications.

* * * * *